US008866140B2

(12) United States Patent
Koike et al.

(10) Patent No.: US 8,866,140 B2
(45) Date of Patent: Oct. 21, 2014

(54) THIN-FILM TRANSISTOR

(71) Applicants: Junichi Koike, Sendai (JP); Pilsang Yun, Sendai-shi (KR); Hideaki Kawakami, Chiba (JP)

(72) Inventors: Junichi Koike, Sendai (JP); Pilsang Yun, Sendai-shi (KR); Hideaki Kawakami, Chiba (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 0 days.

(21) Appl. No.: 13/732,719

(22) Filed: Jan. 2, 2013

(65) Prior Publication Data

US 2013/0112972 A1    May 9, 2013

Related U.S. Application Data

(63) Continuation-in-part of application No. PCT/JP2011/065526, filed on Jun. 30, 2011.

(30) Foreign Application Priority Data

Jul. 2, 2010 (JP) ................. 2010-152112

(51) Int. Cl.
*H01L 29/12* (2006.01)
*H01L 29/45* (2006.01)
*H01L 29/786* (2006.01)

(52) U.S. Cl.
CPC ............ *H01L 29/7869* (2013.01); *H01L 29/45* (2013.01); *H01L 29/78693* (2013.01)
USPC .................... 257/43; 257/E29.117

(58) Field of Classification Search
CPC ............ G02F 1/136286; H01L 27/1214; H01L 29/78618

USPC ............................................. 257/43, E29.117
See application file for complete search history.

(56) References Cited

U.S. PATENT DOCUMENTS

2007/0002239 A1    1/2007 Koike
2010/0201901 A1*   8/2010 Koike et al. ............ 349/43
2011/0068340 A1*   3/2011 Lee et al. ............... 257/59

FOREIGN PATENT DOCUMENTS

JP    2002-069550 A    3/2002
JP       3302894 B2    7/2002
JP    2004-091907 A    3/2004

(Continued)

OTHER PUBLICATIONS

T. Kugimiya et. al., Fully Cu-based Gate and Source/Drain Interconnections for Ultrahigh-Definition LCD's, IMID 2009 Digest, 1193.*

(Continued)

*Primary Examiner* — Thao X Le
*Assistant Examiner* — Patricia Reddington
(74) *Attorney, Agent, or Firm* — Sughrue Mion, PLLC

(57) ABSTRACT

Making it possible to improve adhesion between the semiconductor layer and the electrodes, realize high-speed operation of the thin-film transistor by enhancing ohmic contact between these members, reliably prevent oxidation of the electrode surfaces, and realize an electrode fabrication process with few processing steps. The thin-film transistor 10 of the present invention includes a semiconductor layer 4 composed of oxide semiconductor, a source electrode 5 and a drain electrode 6 that are layers composed mainly of copper, and oxide reaction layers 22 provided between the semiconductor layer 4 and each of the source electrode 5 and drain electrode 6, and high-conductance layers 21 provided between the oxide reaction layers 22 and semiconductor layer 4.

7 Claims, 6 Drawing Sheets

(56) References Cited

FOREIGN PATENT DOCUMENTS

| | | |
|---|---|---|
| JP | 2004-139057 A | 5/2004 |
| JP | 2004-163901 A | 6/2004 |
| JP | 2005-158887 A | 6/2005 |
| JP | 2005-166757 A | 6/2005 |
| JP | 2008-282887 A | 11/2008 |
| JP | 2010-003822 A | 1/2010 |
| JP | 2010-199307 A | 9/2010 |
| WO | 2006/025347 A1 | 3/2006 |

OTHER PUBLICATIONS

Kugimiya, Toshihiro, et al., "Fully Cu-based Gate and Source/Drain Interconnections for Ultrahigh-Definition LCDs," IMID Digest, 2009, pp. 1193-1196, vol. 61, No. 2.

* cited by examiner

FIG.6
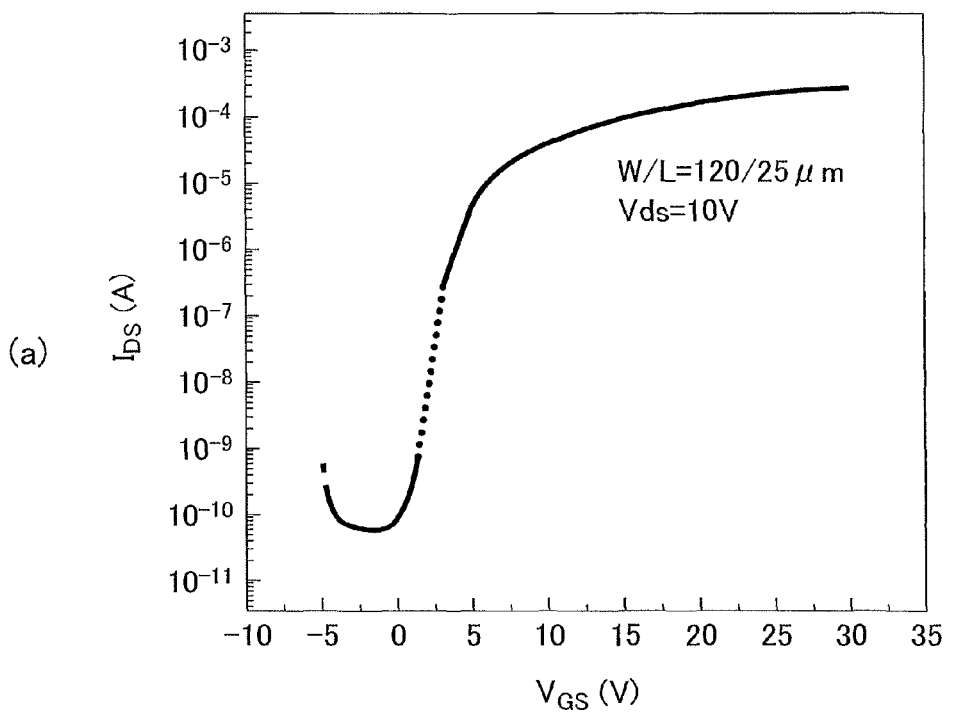
(a)
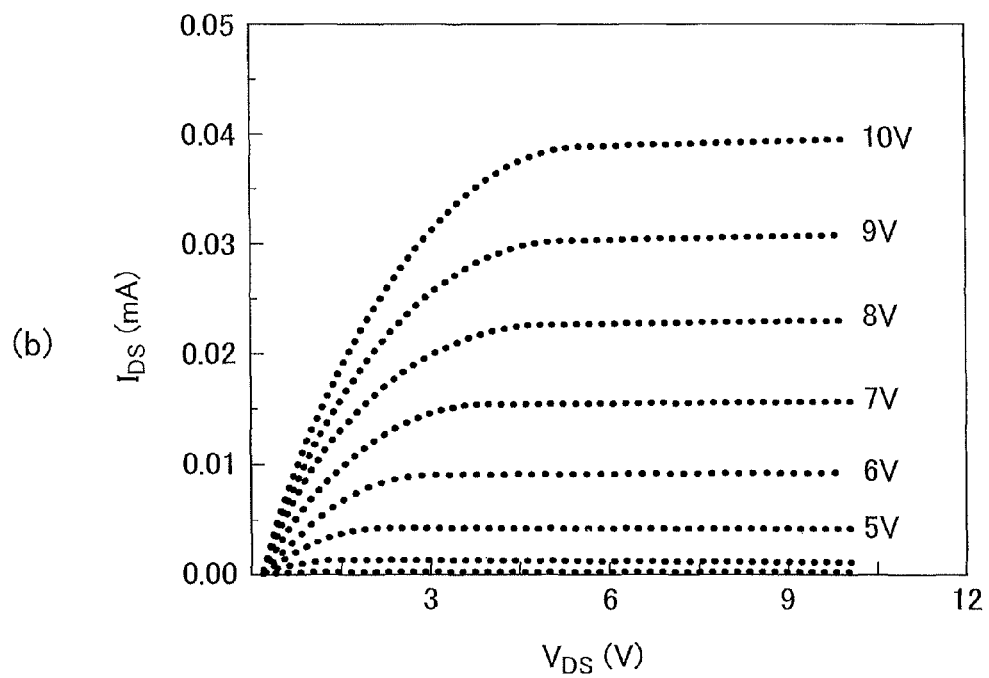
(b)

THIN-FILM TRANSISTOR

CROSS REFERENCE TO RELATED APPLICATIONS

This application is a Continuation-in-Part of International Application No. PCT/JP2011/065526, filed on Jun. 30, 2011, the contents of which are incorporated herein by reference in their entirety.

TECHNICAL FIELD

This invention relates to a thin-film transistor provided with an oxide semiconductor in the semiconductor layer.

BACKGROUND ART

Application of oxide semiconductors to thin-film transistors and transparent electrodes has attracted attention in recent years. Thin-film transistors that utilize oxide semiconductors are being actively applied to flat panel display devices like liquid crystal display devices and organic EL display devices. Moreover, transparent electrodes that utilize oxide semiconductors are being actively applied to flat panel display devices and touch panels.

In these fields of application, materials of low resistance and high electrical conductivity are used in the interconnections and electrodes of the oxide semiconductor.

In these fields of application, aluminum (Al) or Al alloy, molybdenum, and the like are used.

For example, an interconnection material composed of Ti/Al—Si/Ti has been proposed that has a structure of Al—Si sandwiched with Ti.

Copper has come to attract attention as a material having lower electrical resistance than these electrode materials. However, in addition to being poor in adhesion to the TFT substrate of an LCD, that is glass, copper also has a problem of being easily oxidized during insulation layer formation.

In recent years, therefore, attempts have been made to resolve such problems by using a technology that utilizes alloyed copper interconnections in TFT-LCD. This technology is aimed at ensuring adhesion to the substrate by virtue of the alloying elements forming a reaction product with the substrate, and simultaneously at the Cu oxidation resistance action of additive elements by forming oxide on the Cu surface.

However, the sought characteristics are not adequately achieved by the proposed technology. Specifically, the electrical resistance of the Cu increases due to alloying elements persisting in the Cu, and superiority to interconnection material using Al or Al alloy is not exhibited.

In addition, as set out in Patent document 1, a technology for using copper interconnections in TFT-LCD has been developed that forms a Mo alloy film between the Cu and substrate, thereby ensuring substrate adhesion and barrier performance.

However, this technology has problems in that a Mo alloy film-forming process is added and the effective resistance of the interconnections increases. In addition, Cu-only layers are used at the source electrode and drain electrode, so that an issue of their stability remains.

Further, Patent document 2 proposes a technology for overcoming the problems related to Cu interconnections by forming a high-melting-point nitride such as TaN, TiN, WN or the like around the Cu. However, as compared to a conventional interconnection material, this technology has problems in that a material for forming a barrier layer and an additional process are required, and that the effective resistance of the interconnections rises because the high-resistance barrier layer is formed to thick film thickness.

Further, Patent document 3 discloses improvement of adhesion and oxidation resistance by adding one or more elements among Mg, Ti and Cr to the Cu of the TFT-LCD interconnections. However, increase in interconnection resistance owing to the presence of residual additive elements in the interconnections is a problem. Another problem is that the additive elements reduce substrate oxides, and the reduced elements disperse in the interconnections to increase the interconnection resistance.

Patent document 4 discloses enhancement of oxidation resistance by adding 0.3 to 10 wt % Ag to Cu. However, problems exist in that adhesion to glass substrate is not improved and oxidation resistance sufficient to withstand the liquid crystal process is not obtained.

Patent document 5 proposes a copper alloy for improving adhesion obtained by adding 0.5 to 5 wt % of at least one element among Ti, Mo, Ni, Al and Ag to Cu. However, a problem exists in that the additive elements increase the electrical resistance of the interconnections.

Patent document 6 proposes adding 0.1 to 3.0 wt % Mo to Cu and segregating the Mo at the grain boundaries to inhibit oxidation by grain boundary diffusion. However, while this technology can improve Cu resistance to oxidation, it has a problem in that it increases interconnection resistance.

Patent document 7 uses a copper alloy obtained by adding a suitable additive element to Cu, whereby the additive element forms an oxide film acting as a protective coating that inhibits Cu oxidation and forms an insulating layer at an interface adjacent to the protective coating to inhibit interdiffusion. This provides copper interconnections high in electrical conductivity and excellent in substrate adhesion. A liquid crystal display device using the copper interconnections is also provided. It is suggested that one of these external additive elements is preferably Mn. However, this technology is not adequate for concretely realizing the special features of the interconnection structure and TFT electrode structure used in the liquid crystal display device.

Patent document 8 proposes a TFT structure used in a TFT-LCD, and for the case of applying the Cu alloy to a gate electrode, concretely presents a TFT structure whose gate electrode is coated with an oxide film. In this context, where the first metal is Cu, the second metal is designated as at least one selected from among Ti, Zr, Hf, Ta, Nb, Si, B, La, Nd, Sm, Eu, Gd, Dy, Y, Yb, Ce, Mg, Th and Cr. However, these oxide films have a problem in not being capable of adequately inhibiting interdiffusion with the insulating layer.

Non-patent document applies a copper electrode to a TFT using an oxide semiconductor. a-InGaZnO$_x$ is used for the oxide semiconductor, and a laminated structure of pure copper (Cu) and a copper alloy (CuMn) is used as the copper electrode. By this a TFT having about 10 times the mobility of the current a-Si TFT was realized to make high-speed operation possible. In addition, the copper electrode consisting of the aforesaid laminated structure was used to minimize interconnection resistance and increase the possibility of realizing higher definition in a flat display. However, further simplification of the electrode structure is required.

PRIOR ART DOCUMENTS

Patent Documents

Patent document 1: Japanese unexamined patent publication 2004-163901

Patent document 2: Japanese unexamined Japanese patent publication 2004-139057
Patent document 3: Japanese unexamined patent publication 2005-166757
Patent document 4: Japanese unexamined patent publication 2002-69550
Patent document 5: Japanese unexamined patent publication 2005-158887
Patent document 6: Japanese unexamined patent publication 2004-91907
Patent document 7: WO 2006-025347
Patent document 8: Japanese Patent No. 3302894
Non-patent Reference 1: T. Kugimiya, "Fully Cu-based Gate and Source/Drain Interconnections for Ultrahigh-Definition LCDs", IMID 2009 Digest As set out in the foregoing, these conventional technologies endeavor to ensure adhesion to the semiconductor layer or pixel electrode and oxidation resistance by adding alloying additive elements to Cu. In addition, high-speed TFT operation was realized by using oxide semiconductor in the semiconductor layer. However, none has yet achieved adequate results. Further, adequate results have not been obtained with respect to the structural requirements of the source and drain electrodes among the TFT electrodes, namely strong adhesion to the semiconductor layer or pixel electrode, resistance to the use environment, and stability of the electrical bonding of the source electrode or drain electrode.

Although non-patent document 1 is particularly noteworthy for suggesting a thin-film transistor using an oxide transistor with copper interconnections, improvement is still required from the viewpoint of a thin-film transistor for enabling higher definition in a flat display. Realization of single-layer electrodes and interconnections is especially necessary. In addition, too little is clarified about stable electrical bonding between the source and drain electrodes and the semiconductor layer.

In other words, while lowering electrode effective resistance, improving adhesion of the source electrode and drain electrode to the semiconductor layer while simultaneously forming electrically stable joints, preventing electrode surface oxidation, and realizing copper alloy film formation in a small number of processing steps are issues that must all be overcome at the same time, the conventional technologies set out in the foregoing cannot resolve them and the production of actual products is insufficient.

DISCLOSURE OF THE INVENTION

Problems to be Solved by the Invention

The present invention was made to solve the aforesaid problems of the prior art and has its object to provide a thin-film transistor that has improved adhesion between the semiconductor layer and the electrodes, realizes high-speed operation by enhancing ohmic contact between these members, effectively prevents oxidation of the electrode surfaces, and realizes an electrode fabrication process with fewer processing steps.

Means for Solving the Problems

Means (1) to (10) for achieving the object of the present invention are listed below.
(1) A thin-film transistor characterized by comprising a semiconductor layer composed of oxide semiconductor, a source electrode and a drain electrode that are layers composed mainly of copper, and oxide reaction layers formed between the semiconductor layer and, respectively, the source electrode and the drain electrode.
(2) In (1), the thin-film transistor as recited in (1), the semiconductor layer has low-resistance ohmic contact through the oxide reaction layers to the source electrode and the drain electrode
(3) In (1) or (2), the thin-film transistor comprising high-conductance layers between the oxide reaction layers and the semiconductor layer.
(4) In (3), the thin-film transistor, the semiconductor layer has low-resistance ohmic contact through the oxide reaction layers and the high-conductance layers to the source electrode and the drain electrode.
(5) In (1) to (4), the thin-film transistor, the semiconductor layer is amorphous In—Ga—Zn—$O_x$.
(6) In (5), the thin-film transistor, the high-conductance layers are rich in In concentration.
(7) In any of (1) to (6), the thin-film transistor, the source electrode and drain electrode are composed of Cu—Mn alloy.
(8) In any of (1) to (7), the thin-film transistor, the oxide reaction layers are composed mainly of $MnO_x$.
(9) In (8), the thin-film transistor, the oxide reaction layers contain Cu, In, Ga and Zn.
(10) In any of (1) to (9), the thin-film transistor, the oxide reaction layers are formed in contact with the Cu—Mn alloy forming the surface layers of the source electrode and the drain electrode.

Effect of the Invention

In accordance with the present invention, the provision of an oxide reaction layer between the semiconductor layer comprising the oxide semiconductor and, respectively, makes it possible to improve adhesion between the source electrode and the semiconductor layer and adhesion between the drain electrode and the semiconductor layer.

Further, the thin-film transistor can achieve high-speed operation because the semiconductor layer comes to acquire low-resistance ohmic contact to the source electrode and the drain electrode through the oxide reaction layers. Moreover, owing to the formation of the oxide reaction layers on the electrode surfaces, oxidation of the copper-based electrodes can be prevented. In addition, the electrode fabrication process is shortened to help simply the TFT fabrication process and thus enable production cost reduction.

Further, the additional provision of the high-conductance layers between the oxide reaction layers and the semiconductor layer further enhances ohmic contact, thereby making it possible to realize still faster operation of the thin-film transistor.

BRIEF DESCRIPTION OF THE DRAWINGS

FIG. 6 is a set of diagrams showing characteristics of the thin-film transistor of the present invention, in which (a) is a graph showing $I_{DS}$ versus $V_{GS}$ (transfer characteristic) and (b) is a graph showing $I_{DS}$ versus $V_{DS}$ (output characteristic) at different $V_G$.

Figure 1:
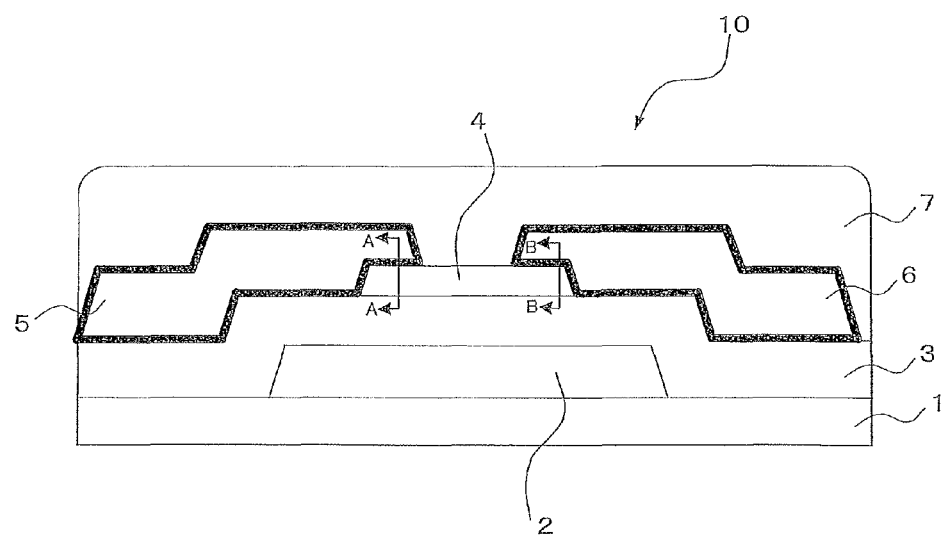
FIG. 1 is a diagram showing the cross-sectional structure of a thin-film transistor according to the present invention.

DESCRIPTION OF REFERENCE NUMERALS 1 substrate
2 gate electrode
3 gate insulating film
4 semiconductor layer
5 source electrode
6 drain electrode
7 protective film
10 thin-film transistor
20 interface
21 In rich layer
22 oxide reaction layer

BEST MODE FOR CARRYING OUT THE INVENTION

An embodiment of this invention will be described in detail below. FIG. 1 is a diagram showing the cross-sectional structure of a thin-film transistor according to the present invention. The thin-film transistor (TFT) 10 in FIG. 1 functions as a drive device that performs display driving of, for example, a liquid crystal display, organic EL (Electro Luminescence) display or the like, and has a bottom gate structure, for example.

The thin-film transistor 10 has a gate electrode 2 at a selected region on a substrate 1 composed of glass, plastic or the like. A gate insulating film 3 is formed so as to cover the gate electrode 2 and substrate 1. A semiconductor layer 4 is provided on the gate insulating film 3, and a source electrode 5 and a drain electrode 6 are arranged locally on the semiconductor layer 4 in a predetermined pattern. And a protective film (passivation film) 7 is overlaid on the source electrode 5, drain electrode 6, and semiconductor layer 4.

The gate electrode 2, source electrode 5 and drain electrode 6 are formed of Cu—Mn alloy. These Cu—Mn films are formed by sputtering and then annealed at 250° C. in an atmosphere of sufficient oxygen. It should be noted that it suffices for at least the surface regions of the gate electrode 2, source electrode 5 and drain electrode 6 to consist of Cu—Mn, and as a whole the interior can be formed of Cu in the manner of, for example, Cu—Mn/Cu/Cu—Mn.

The gate insulating film 3 and the protective film 7 are formed of silicon oxide ($SiO_x$).

The semiconductor layer 4 is an oxide semiconductor, and is formed of amorphous In—Ga—Zn—$O_x$ (a-IGZO).

As stated above, the semiconductor layer 4 and each of the source electrode 5 and the drain electrode 6 have regions that contact each other locally, and the interfaces at these regions are provided with a characteristic configuration to the present invention. This interface structure will be descried using FIG. 2, FIG. 3 and FIG. 4.

It should be noted that while the interface structure between the semiconductor layer 4 and the source electrode 5 will be described using FIG. 2, FIG. 3 and FIG. 4, the interface structure between the semiconductor layer 4 and the drain electrode 6 (section B-B of FIG. 1) will not be described here because it is the same.

Figure 2:
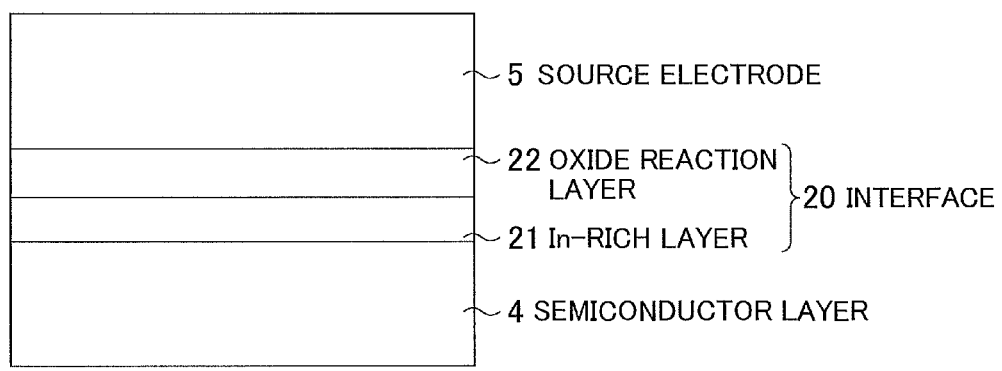
FIG. 2 is a sectional view taken along A-A of FIG. 1 showing an interface between a semiconductor layer and a source electrode.

FIG. 2 is a cross-sectional view along A-A of FIG. 1 showing the interface between the semiconductor layer and the source electrode. As shown in FIG. 2, at the interface 20 between the semiconductor layer 4 and the source electrode 5, an In-rich layer 21 is formed in contact with the semiconductor layer 4 and an oxide reaction layer 22 is further formed in contact with the In-rich layer 21.

Figure 3:
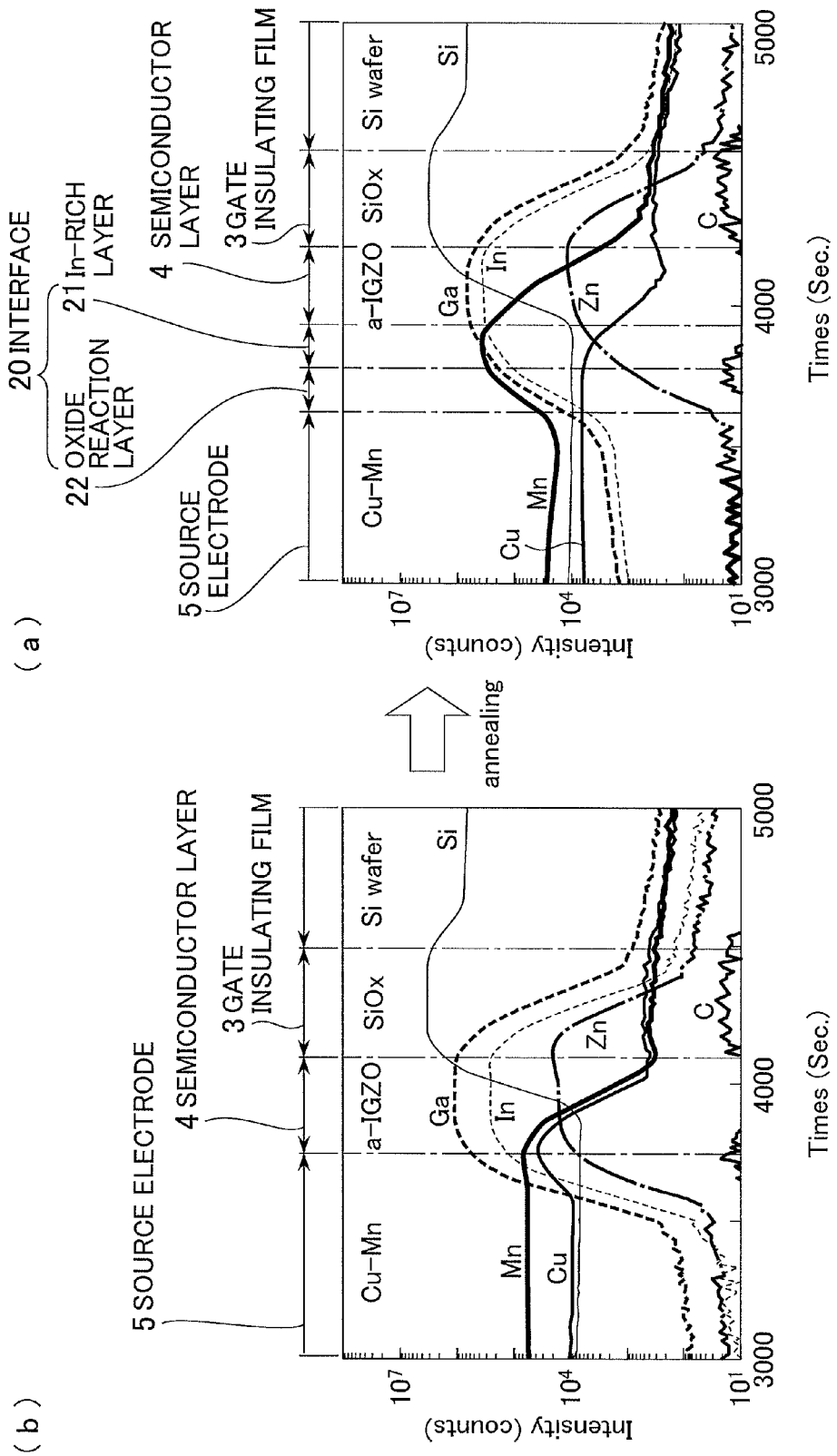
FIG. 3 is a set of diagrams showing the results of SIMS analysis of an oxide semiconductor, a source electrode, and their interface, before and after high-temperature annealing, in which FIG. (3b) shows the results before annealing and FIG. 3(a) the results after annealing.

FIG. 3 is a set of diagrams showing the results of SIMS analysis of the oxide semiconductor and the source electrode, and their interface, before and after annealing. FIG. 3(b) on the left shows the results of the SIMS analysis before annealing, in the as-deposited condition, and FIG. 3(a) on the right shows the results of the SIMS analysis after annealing.

It can be seen that at the stage before annealing shown in FIG. (3b), the oxide reaction layer 22 and other reaction layers are not formed at the interface.

FIG. 3(a) shows the results after annealing at 250° C. for one hour. The oxide reaction layer 22 and the In-rich layer 21 are formed by thermal diffusion at the interface 20 between the semiconductor layer 4 composed of a-IGZO and the source electrode 5 composed of Cu—Mn. The oxide reaction layer 22 is a layer composed mainly of $MnO_x$, i.e., oxide of Mn, that is a constituent element of the source electrode 5, and contains In, Ga and Zn, constituent elements of the semiconductor layer 4, and also contains Cu, a constituent element of the source electrode 5.

The In-rich layer 21 is formed between the oxide reaction layer 22 and the semiconductor layer 4, and In, a constituent element of the semiconductor layer 4, is concentrated therein.

From a look at the composition distribution in the interface 20 composed of the oxide reaction layer 22 and the In-rich layer 21, it can be seen that the interface 20 inhibits the diffusion of Cu from the source electrode 5 to the semiconductor layer 4 and inhibits the diffusion of In, Ga and Zn from the semiconductor layer 4 to the source electrode 5, i.e., so that the interface 20 functions as a barrier layer. Further, the interface 20 markedly improves adhesion between the semiconductor layer 4 and the source electrode 5.

Figure 4:
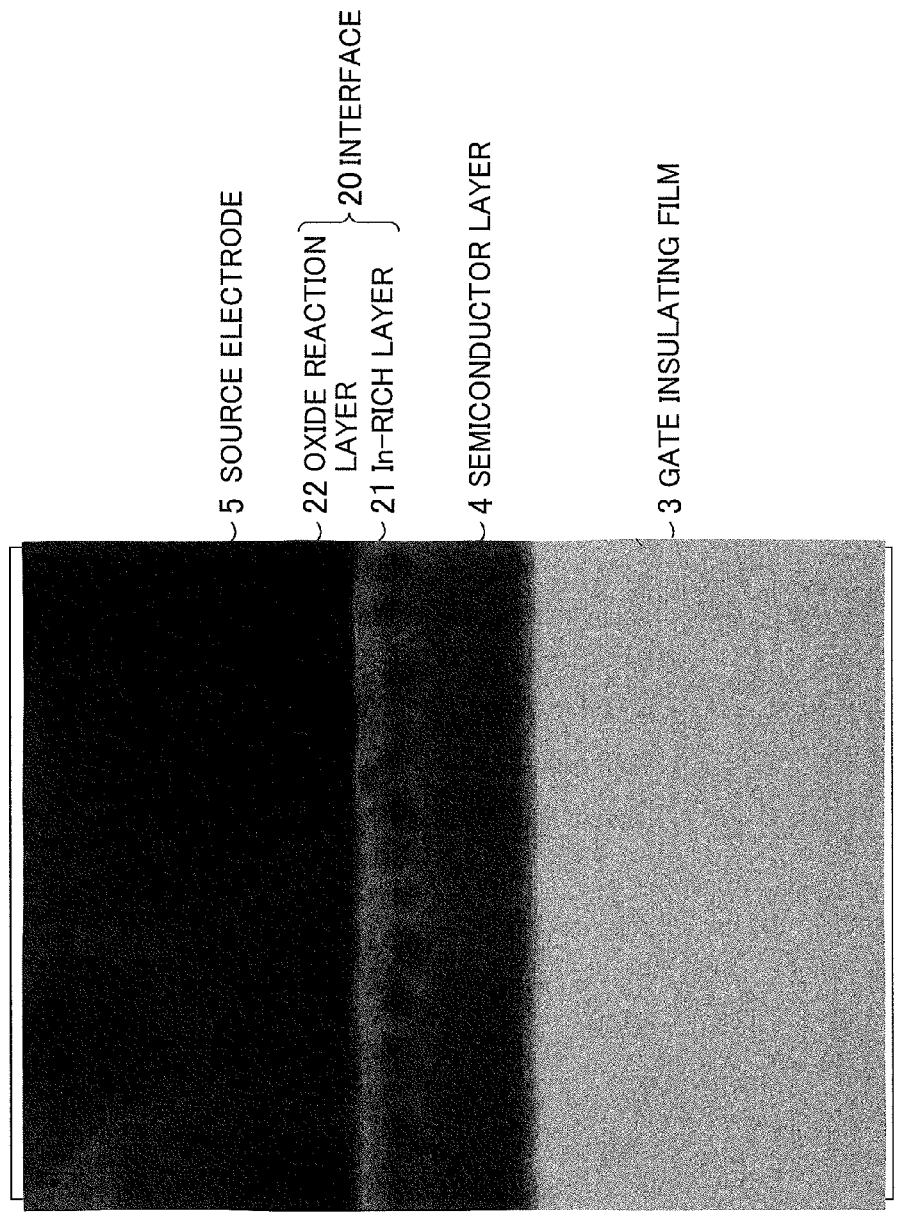
FIG. 4 is a transmission electron micrograph after annealing, showing a cross-sectional image of the oxide reaction layer formed at the interface between the source electrode and the oxide semiconductor layer.

FIG. 4 is an electron micrograph showing a cross-section between the annealed oxide reaction layer and the semiconductor layer. In FIG. 4, the interface 20 between the semiconductor layer 4 and the source electrode 5 has a thickness of several nm and is formed with the oxide reaction layer 22 and In-rich layer 21. Many fine crystal grains of In are observed in the In-rich layer 21.

Next, electrical characteristics of the thin-film transistor 10 of the present invention will be described using FIG. 5 and FIG. 6.

Figure 5:
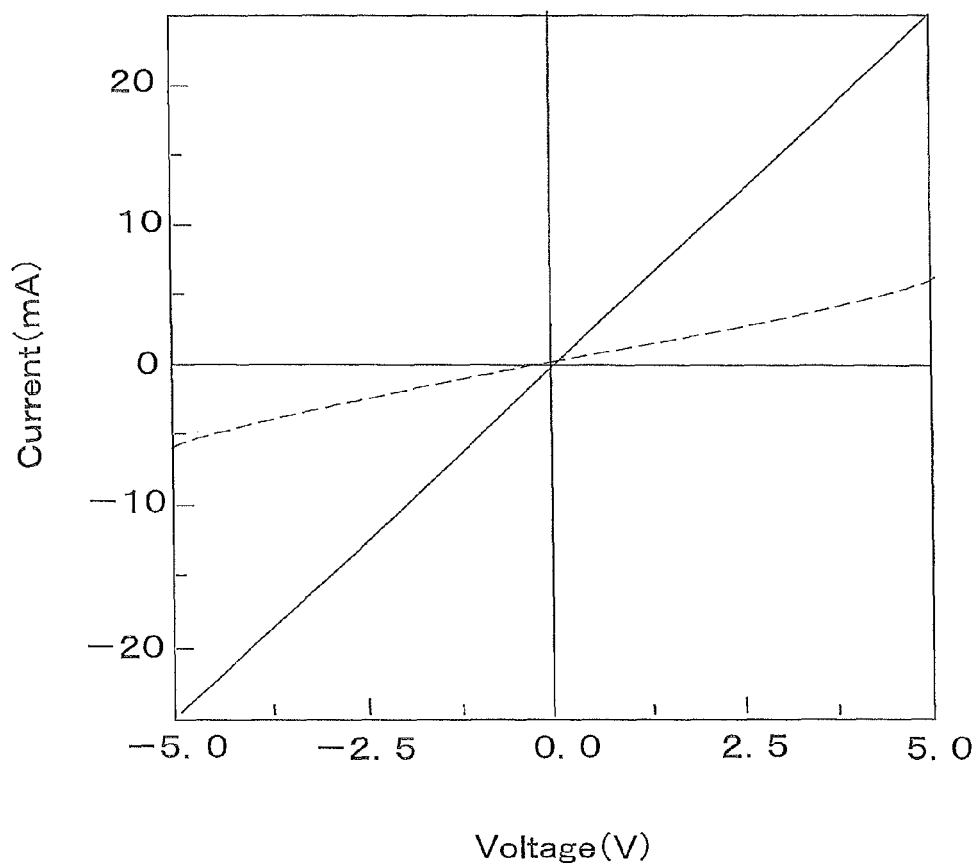
FIG. 5 is a diagram showing the voltage-current characteristics between the semiconductor layer and, respectively, the source electrode and the drain electrode.

FIG. 5 is a diagram showing the voltage-current characteristics between the source electrode and drain the electrode with the semiconductor layer in between the two electrodes. The case where Al was used for the electrodes is indicated by the broken line, and the case where Cu—Mn alloy was used is indicated by the solid line. Although, nonlinearity can be seen in the voltage-current characteristic when Al is used for the electrodes, the voltage-current characteristic is linear when CuMn alloy is used for the electrodes. This verifies the fact that, electrically, the Cu—Mn electrodes have ohmic contact with the oxide semiconductor layer. In the case of the Cu-4 at. % Mn alloy, contact resistivity is in the range of 1.2 to $2.9 \times 10^{-4}$ $\Omega \cdot cm^2$.

Thus, the semiconductor layer 4 comes to have low-resistance ohmic contact through the oxide reaction layer 22 and the In-rich layer 21 to each of the source electrode 5 and the drain electrode 6, thereby enabling high-speed operation of the thin-film transistor 10.

A major cause of the resistance reduction is believed to be that the In-rich layer 21 formed in contact with the a-IGZO semiconductor layer 4 acts as a low-resistance n$^+$ a-IGZO layers that becomes a high-conductance layer.

FIG. 6 is a set of diagrams showing the electrical characteristics of the thin-film transistor of the present invention, in which (a) is a graph showing drain-source current ($I_{DS}$) versus gate-source voltage ($V_{GS}$) (transfer characteristic) and (b) is a graph showing $I_{Ds}$ versus drain-source voltage ($V_{DS}$) (output characteristic) at different values of gate voltage ($V_G$). From FIG. 6, the following TFT parameters are obtained; field-effect mobility of 7.62 cm$^2$/Vs, threshold voltage of 8.2 V, and ON/OFF current ratio of 10$^7$. From these values, it is verified that the mobility of the thin-film transistor 10 of the present invention is about tenfold that of the conventional amorphous silicon (a-Si) TFT. In addition, the values demonstrate that it has performance capabilities adequate for driving a high-definition flat panel display.

As set out in the foregoing, in accordance with the present invention, adhesion between the semiconductor layer 4 and each of the source electrode 5 and the drain electrode 6 can be improved because the oxide reaction layer 22 and the In-rich layer 21 are provided between the semiconductor layer 4 made of the oxide semiconductor and each of the source electrode 5 and drain electrode 6. Further, the semiconductor layer 4 comes to have low-resistance ohmic contact through the oxide reaction layer 22 and the In-rich layer 21 to each of the source electrode 5 and the drain electrode 6, thereby enabling high-speed operation of the thin-film transistor 10. Still further, oxidation of the electrodes composed mainly of copper can be prevented because the oxide reaction layer 22 and the In-rich layer 21 are provided on the electrode surfaces. In addition, the number of electrode fabrication process steps is decreased to help simply the TFT fabrication process and thus production cost can be reduced.

Further, the In-rich layer 21 between the oxide reaction layer 22 and the semiconductor layer 4 becomes a high-conductance layer, so that ohmic contact is further enhanced to enable still faster operation of the thin-film transistor 10.

Further, when the semiconductor layer 4 is an oxide semiconductor and is a-IGZO, the In-rich layer 21 between the oxide reaction layer 22 and the semiconductor layer 4 is thought to act as a n$^+$ a-IGZO layer. The n$^+$ a-IGZO layer is generally formed by doping impurity elements to increase carrier density in a semiconductor film. In the present invention, the spontaneous formation of the n$^+$ a-IGZO layer is realized by annealing to let Mn react with a-IGZO, so that a n$^+$ a-IGZO forming process can be simplified.

Although the foregoing description was made with respect to the case of forming the In-rich layer 21 between the semiconductor layer 4 and the oxide reaction layer 22, it should be noted that it is also acceptable to form only the oxide reaction layer 22 at the interface 20, in which case the improvement of adhesion, good ohmic contact, prevention of electrode oxidation, shortening of the fabrication process and other such effects can be similarly implemented.

The invention claimed is:

1. A thin-film transistor characterized by comprising:
   a semiconductor layer composed of oxide semiconductor;
   a source electrode and a drain electrode that are layers composed mainly of copper;
   oxide reaction layers formed between the semiconductor layer and, respectively, the source electrode and the drain electrode; and
   high-conductance layers between the oxide reaction layers and the semiconductor layer,
   wherein the high-conductance layers are rich in In concentration.

2. The thin-film transistor recited in claim 1, wherein the semiconductor layer has low-resistance ohmic contact through the oxide reaction layers and the high-conductance layers to the source electrode and the drain electrode.

3. The thin-film transistor as recited in claim 1, wherein the semiconductor layer is amorphous In—Ga—Zn—Ox.

4. The thin-film transistor as recited in claim 1, wherein the source electrode and drain electrode are composed of Cu—Mn alloy.

5. The thin-film transistor as recited in claim 1, wherein the oxide reaction layers are composed mainly of MnOx.

6. The thin-film transistor as recited in claim 5, wherein the oxide reaction layers contain Cu, In, Ga and Zn.

7. The thin-film transistor as recited in claim 1, wherein the oxide reaction layers are formed in contact with the Cu—Mn alloy forming surface layers of the source electrode and the drain electrode.

* * * * *